(12) United States Patent
Dehner et al.

(10) Patent No.: US 10,261,939 B2
(45) Date of Patent: Apr. 16, 2019

(54) PERFORMING LOOKUP TABLE OPERATIONS ON A SINGLE-INSTRUCTION MULTIPLE DATA PROCESSOR

(71) Applicants: Leo G. Dehner, Austin, TX (US); Jayakrishnan C. Mundarath, Austin, TX (US); Peter Z. Rashev, Calgary (CA)

(72) Inventors: Leo G. Dehner, Austin, TX (US); Jayakrishnan C. Mundarath, Austin, TX (US); Peter Z. Rashev, Calgary (CA)

(73) Assignee: NXP USA, Inc., Austin, TX (US)

( * ) Notice: Subject to any disclaimer, the term of this patent is extended or adjusted under 35 U.S.C. 154(b) by 1086 days.

(21) Appl. No.: 14/464,134

(22) Filed: Aug. 20, 2014

(65) Prior Publication Data

US 2016/0054995 A1 Feb. 25, 2016

(51) Int. Cl.
*G06F 15/80* (2006.01)
*G06F 9/30* (2018.01)
(Continued)

(52) U.S. Cl.
CPC ........ *G06F 15/8061* (2013.01); *G06F 9/3001* (2013.01); *G06F 9/3004* (2013.01); *G06F 9/30036* (2013.01); *G06F 9/30043* (2013.01); *G06F 9/3887* (2013.01); *G06F 15/8007* (2013.01); *G06F 15/8015* (2013.01); *G06F 15/8053* (2013.01); *G06F 17/10* (2013.01); *H03F 1/3241* (2013.01); *H03F 1/3247* (2013.01); *H03F 2201/3233* (2013.01);
(Continued)

(58) Field of Classification Search
CPC ....... G06F 9/00–9/3897; G06F 15/00–15/825; G06F 9/30036; G06F 9/3887; G06F 15/8007; G06F 15/8015; G06F 15/8053; G06F 15/8061; H03F 2201/3233; H03F 1/3241; H03F 1/3247; H04B 2001/0425; H04B 1/62; H04L 27/367; H04L 27/368
See application file for complete search history.

(56) References Cited

U.S. PATENT DOCUMENTS 5,008,752 A * 4/1991 Van Nostrand ....... G06T 3/4007
348/581
5,530,661 A * 6/1996 Garbe ...................... G06F 1/03
708/319

(Continued)

*Primary Examiner* — Keith E Vicary (57) ABSTRACT

In accordance with at least one embodiment, a processor system is disclosed having a SIMD processor device that has a plurality of subsidiary processing elements that are controlled to process multiple data concurrently. In accordance with at least one embodiment, the SIMD processor is a vector processor (VPU) having a plurality of vector Arithmetic Units (AUs) as subsidiary processing elements, and the VPU executes an instruction to transfer table information from a global memory of the VPU to a plurality of local memories accessible by each AU. The VPU also executes an instruction that results in each processing element performing a table lookup from a table stored at its local memory. In response to the instruction, this table lookup uses a portion of a lookup value to access information from the table, and uses another portion of the lookup information to calculate an interpolated resultant based upon the accessed information.

20 Claims, 7 Drawing Sheets

(51) Int. Cl.
- *G06F 17/10* (2006.01)
- *G06F 9/38* (2018.01)
- *H04B 1/62* (2006.01)
- *H04L 27/36* (2006.01)
- *H03F 1/32* (2006.01)
- *H04B 1/04* (2006.01)

(52) U.S. Cl.
CPC ........ *H04B 1/62* (2013.01); *H04B 2001/0425* (2013.01); *H04L 27/367* (2013.01); *H04L 27/368* (2013.01)

(56) References Cited

U.S. PATENT DOCUMENTS

| | | | | |
|---|---|---|---|---|
| 6,249,857 B1* | 6/2001 | Klapman | | G06F 7/48 712/23 |
| 6,665,768 B1* | 12/2003 | Redford | | G06F 12/0607 365/230.03 |
| 6,931,511 B1* | 8/2005 | Weybrew | | G06F 9/30021 712/222 |
| 7,055,018 B1* | 5/2006 | Bratt | | G06F 9/30018 712/4 |
| 7,114,058 B1* | 9/2006 | Trivedi | | G06F 9/30014 712/215 |
| 8,458,445 B2* | 6/2013 | Wilson | | G06F 9/3001 712/225 |
| 2003/0154349 A1* | 8/2003 | Berg | | G06F 9/342 711/137 |
| 2004/0010321 A1* | 1/2004 | Morishita | | G06F 9/30036 700/2 |
| 2004/0054879 A1* | 3/2004 | Macy, Jr. | | G06F 9/30014 712/221 |
| 2004/0120420 A1* | 6/2004 | Hongo | | H03F 1/02 375/297 |
| 2004/0153623 A1* | 8/2004 | Buchty | | G06F 9/30036 711/221 |
| 2007/0185953 A1* | 8/2007 | Prokopenko | | G06F 7/483 708/523 |
| 2008/0243899 A1* | 10/2008 | Staudinger | | H03F 1/3247 |
| 2010/0174883 A1* | 7/2010 | Lerner | | G06F 9/30014 712/11 |
| 2013/0212353 A1* | 8/2013 | Mimar | | G06F 9/345 712/4 |
| 2014/0086361 A1* | 3/2014 | Azadet | | H04L 1/0054 375/297 |

* cited by examiner

PERFORMING LOOKUP TABLE OPERATIONS ON A SINGLE-INSTRUCTION MULTIPLE DATA PROCESSOR

BACKGROUND

Field of the Disclosure

The present disclosure relates generally to data processing and more particularly to applications and uses of single-instruction multiple data processors.

Description of the Related Art

Some computer architectures include instructions, referred to as Single Instruction Multiple-Data (SIMD) instructions, that cause an operation to be performed on multiple elements of data. The SIMD processor architecture may include multiple processing units, each capable of operating on one of the multiple data elements in response to a single instruction.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A processor system is disclosed having a SIMD processor device. The SIMD processor device has a plurality of subsidiary processing elements that are controlled to process multiple data concurrently. The SIMD processor can be a vector processor (VPU) having a plurality of vector Arithmetic Units (AUs) as subsidiary processing elements. The VPU can execute an instruction to transfer table information from a global memory of the VPU to a plurality of local memories accessible by each of the subsidiary processing elements, e.g., the AUs. The VPU can also execute an instruction that results in each subsidiary processing element performing a table lookup from a table stored at its local memory. In response to the instruction, this table lookup can use a portion of a lookup value to access information from the table, and another portion of the lookup information to calculate an interpolated resultant based upon the accessed information.

The disclosed SIMD look-up instruction can be used in various applications, including in a communication device to process digital representations of analog signals for transmission. For example, the table transfer and lookup instructions can be used by the system to transfer tables that are used to calculate the amount of compensation to be introduced into a transmit signal to compensate for power amplifier distortion. Thus, a communication device can determine a compensation function and generate lookup tables based upon the determined compensation function to aid in calculating the amount of compensation to be implemented for specific transmit signals. The use of the lookup tables can enable timely access of compensation information that is used to compensate a transmit signal for expected power amplifier distortion. This compensation is called digital pre-distortion.

Figure 1:
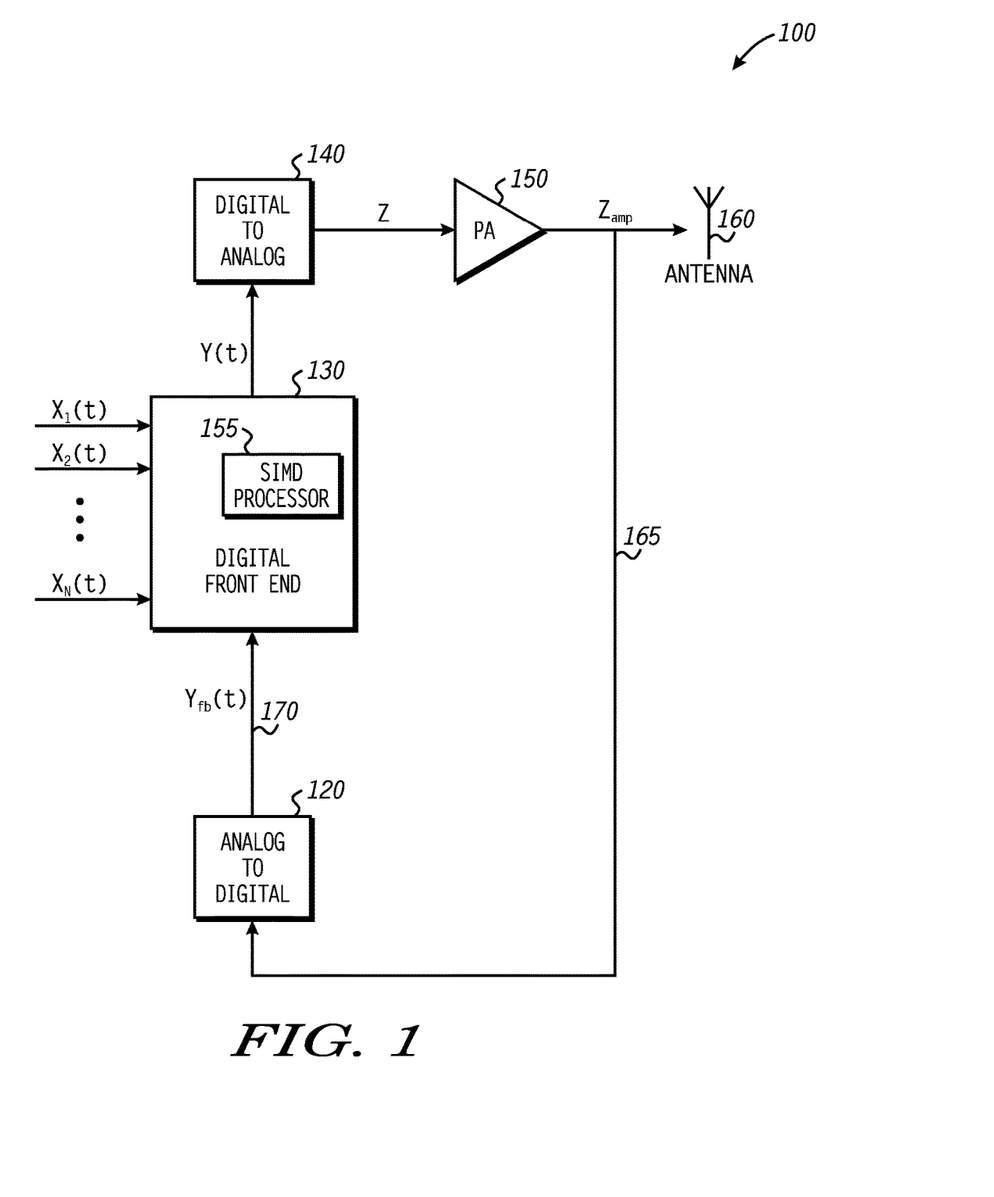
FIG. 1 is a block diagram illustrating a portion of a wireless device in accordance with a specific embodiment of the present disclosure.

FIG. 1 is a block diagram illustrating at least a portion of a communication device 100 in accordance with a specific embodiment of the present disclosure, which can be a wireless communication device. Wireless device 100 includes various circuitry including an analog-to-digital module 120, a digital front-end 130, a digital to analog module 140, a power amplifier 150, and an antenna 160.

Digital front-end 130 receives a sequence of baseband digital signals for each one of a plurality of channels, indicated by $x_i(t)$, where the index i refers to separate channels, and (t) indicates that the channel $x_i$ is represented by multiple elements over time. (E.g., a channel $x_i(t)$ can include the elements $x_i(t0), x_i(t1), \ldots$) Digital front-end 130 processes the baseband digital signals and sends a transformed digital representation of an analog signal, indicated by Y(t), to digital to analog module 140. Part of the processing of the baseband signals can include combining the multiple input channels into a single signal, and performing digital pre-distortion to compensate for non-linearity of the system. The digital front-end 130 can include multiple processors, including SIMD processor 155.

The signal Y(t) is provided to digital-to-analog module 140, which converts the transformed digital signal Y(t) to an analog RF signal Z that is sent to power amplifier 150 for amplification and transmission through antenna 160.

Power amplifier 150 may distort signals that it amplifies. In order to compensate for the distortion of the amplified signal, the digital front-end can receive feedback from the amplifier 150 to determine the manner of distortion (e.g., a distortion profile). Once the distortion profile is known, the digital front-end 130 can compensate for expected distortion. The compensation for expected amplifier distortion may be determined empirically by monitoring the amplified RF signal obtained via the feedback path to determine the distortion introduced at the transmitted signal, thereby enabling determination of a distortion compensation function that can be used to pre-distort the signal prior to the amplifier 150. In FIG. 1, a sampling 165 of the signal from power amplifier 150 is sent to analog-to-digital (ADC) module 120 for conversion back to digital, and the converted digital signal 170 is sent to digital front-end 130 for analysis. Based upon this analysis, a pre-distortion function can be determined that is applied to the signal data path of the DFE 130 so that the transformed signal Y(t) is pre-distorted based upon the pre-distortion function.

In order to facilitate implementation of a distortion compensation function by DFE 130, a plurality of lookup tables can be used. A value used to access a lookup table is referred to herein as a "lookup value." A value retrieved from a lookup table based on the lookup value is referred to as a "lookup table resultant," a "lookup resultant," and a "resultant." According to one embodiment, the lookup value used to implement digital pre-distortion can be based upon the digital values of a pre-distorted analog transmit signal. Because it is desirable for the amount of local memory available to each AU of a VPU to be relatively small, it is desirable for lookup tables stored locally to AUs to also be small. Therefore, because the total number of possible lookup values can large, the number of lookup values stored at a lookup table can be reduced by using interpolation in conjunction with accessing table information.

In many embodiments, a communication device can have multiple antennas and multiple power amplifiers to handle different signals. In such a case, the amplifier distortion may differ for each signal (e.g., based upon the different power amplifiers), and DFE 130 may determine separate compensation functions to compensate for power amplifier distortion of each amplifier. Separate lookup tables may be used for the separate functions.

Figure 2:
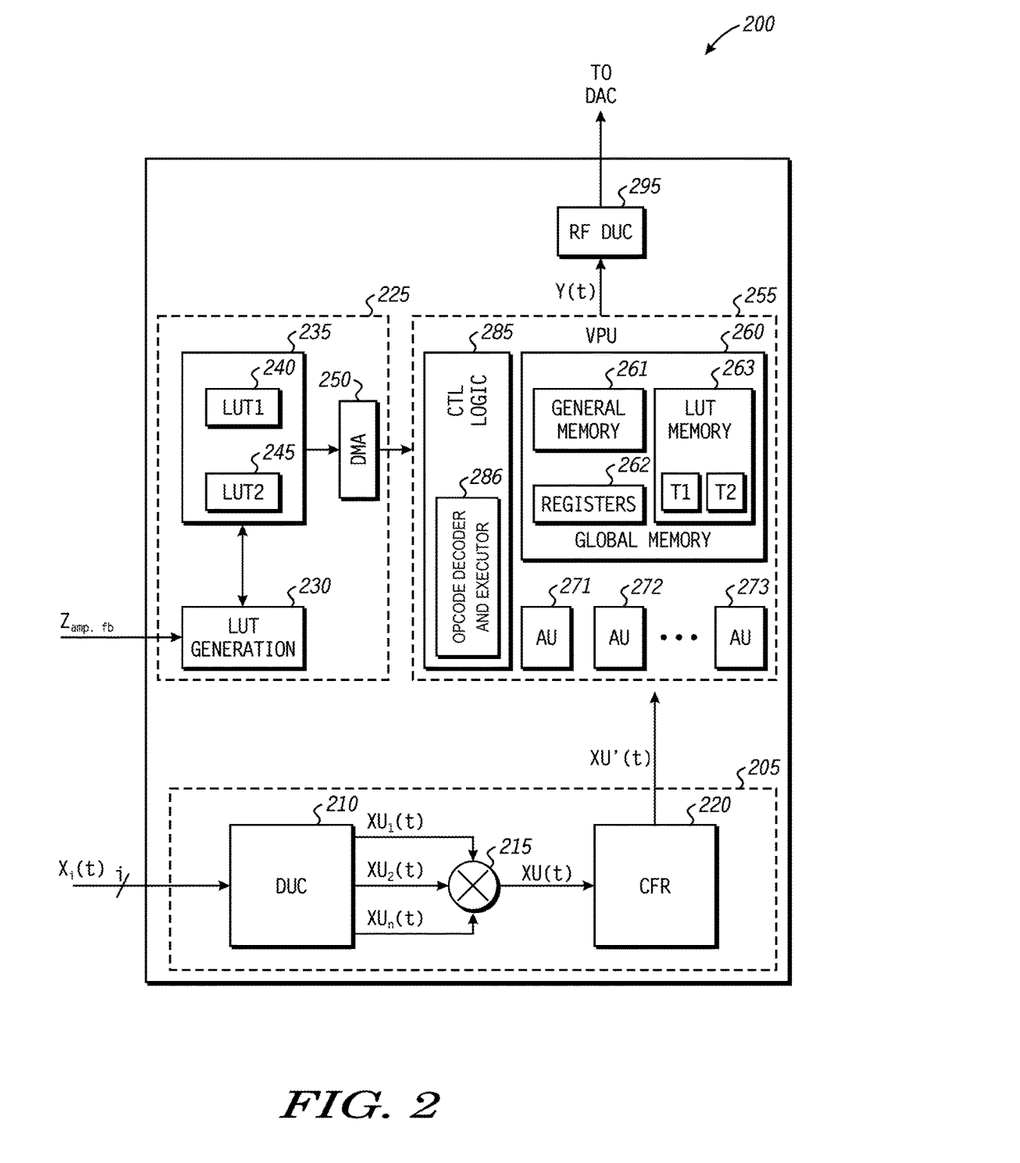
FIG. 2 is a block diagram illustrating a particular embodiment of a digital front-end of FIG. 1 in greater detail.

FIG. 2 is a block diagram illustrating a digital front-end 200, which can be a particular embodiment of digital front-end 130 of FIG. 1. The components of digital front-end 200 are grouped into three regions that can correspond to three processor cores, referred to as processors 205, 225, and 255. Also illustrated at FIG. 2 is a radio-frequency (RF) digital up-converter (DUC) 295.

Core 205 includes DUC 210, mixer 215, and crest factor reduction module (CFR) 220. DUC 210 can up-convert in-phase (I) and quadrature (Q) components of an incoming signal to an intermediate frequency. The incoming information can be represented by separate channels. The symbol $x_i(t)$ represents ith channel of the incoming signal at a time t. (E.g., a channel $x_1(t)$ can include the elements $x_1(t0)$, $x_1(t1)$, . . . where the tj refers to time.) The up-converted signals for the separate channels, denoted by $Xu_i(t)$, are combined by mixer 215 to form a single mixed signal. The resultant mixed signal, denoted by Xu(t), is input to crest factor reduction module (CFR) 220. CFR 220 can limit high-power peaks on the up-converted mixed signal Xu(t) to a specified value, thereby reducing the Peak-to-Average Power parameter of the signal. The CFR 220 transformed signal, Xu'(t), is sent to core 255. In some embodiments, the signals may be sent over a high-speed serial or parallel interface.

Processor device 255 is a SIMD processor that is presumed to be a vector processor unit (VPU), and is illustrated to include control logic 285, various memory 260, and a plurality of Arithmetic Units (AUs) 271-273, which represent a plurality of vector AUs. Processor device 255 may be an embodiment of SIMD processor 155 of FIG. 1. Various memory 260 includes general memory 261, registers 262, and LUT memory 263. Each AU includes a local memory and can simultaneously implement one of a plurality of commands under control of the control logic 285. The control logic 285 can include various control circuitry, such as Input/Output interface circuitry and pipeline modules, to interface with other cores 205 and 225 and to execute instruction opcodes. For example, control logic 285 can include an instruction pipeline that controls the fetching and execution of instructions, which can be accomplished using AUs 271-273. A portion 286 of the control logic 285 can represent that portion of the control logic that decodes and executes a particular opcode, which can include providing control signals to the AUs 271-273.

In accordance with the particular application illustrated in FIG. 2, VPU 255 can apply a distortion compensation function to the incoming digital signal Xu'(t) to generate the distortion-compensated signal Y(t). The signal Y(t) can pass through RF DUC 295 for up-conversion and can be provided to a digital-to-analog converter to generate an analog signal that can be amplified by a power amplifier and transmitted through an antenna as previously described.

Digital pre-distortion calculations performed by VPU 255 can involve the use of a set of lookup tables that can be generated by core 225 using known digital pre-distortion techniques and stored at its local memory 235. Core 225 includes LUT generation 230, DMA 250, and local memory 235. Local memory 235 includes LUT1 240 and LUT2 245. A generated set of lookup tables, such as a set of digital pre-distortion lookup tables, can include a plurality of lookup tables that can be accessed using lookup values based on values of signal Xu'(t) used to calculate each component of the distortion-compensated signal Y(t). The set of digital pre-distortion lookup tables can be transferred from local memory 235 of core 225 to the lookup table memory 263 of core 255 using DMA 250. According to an embodiment, the lookup table memory 263 is large enough to store at least two sets of digital pre-distortion lookup tables, so one set of tables can be used by VPU 255 while another set of tables is being received at VPU 255.

One table at a time from the set of digital pre-distortion tables stored at the lookup table memory 260 can be used by VPU 255 to calculate each element of Y(t). For example, a table transfer instruction can be executed by the VPU 255 to transfer one of the plurality of tables of the set of tables T1 to local memory of each one of the AUs 271-273. In some embodiments, the size of the table transferred may be fixed by hardware. In further embodiments, a user-selectable parameter may indicate the size of the table. The user, for example, may be able to select between 128- and 256-row tables. In many embodiments, each table in a set may have the same size.

A table lookup instruction can then be executed by VPU 255 that causes each AU to access its locally stored copy of that table to retrieve lookup resultants used to implement a pre-distortion algorithm. The table lookup instruction can result in execution of one or more memory access operations that retrieve lookup table resultants, and an interpolation operation that uses the lookup table resultants to determine an interpolated lookup resultant. Execution of the table lookup instruction may involve use of registers 262 to store operands for the instruction and results of the instruction.

Figure 3:
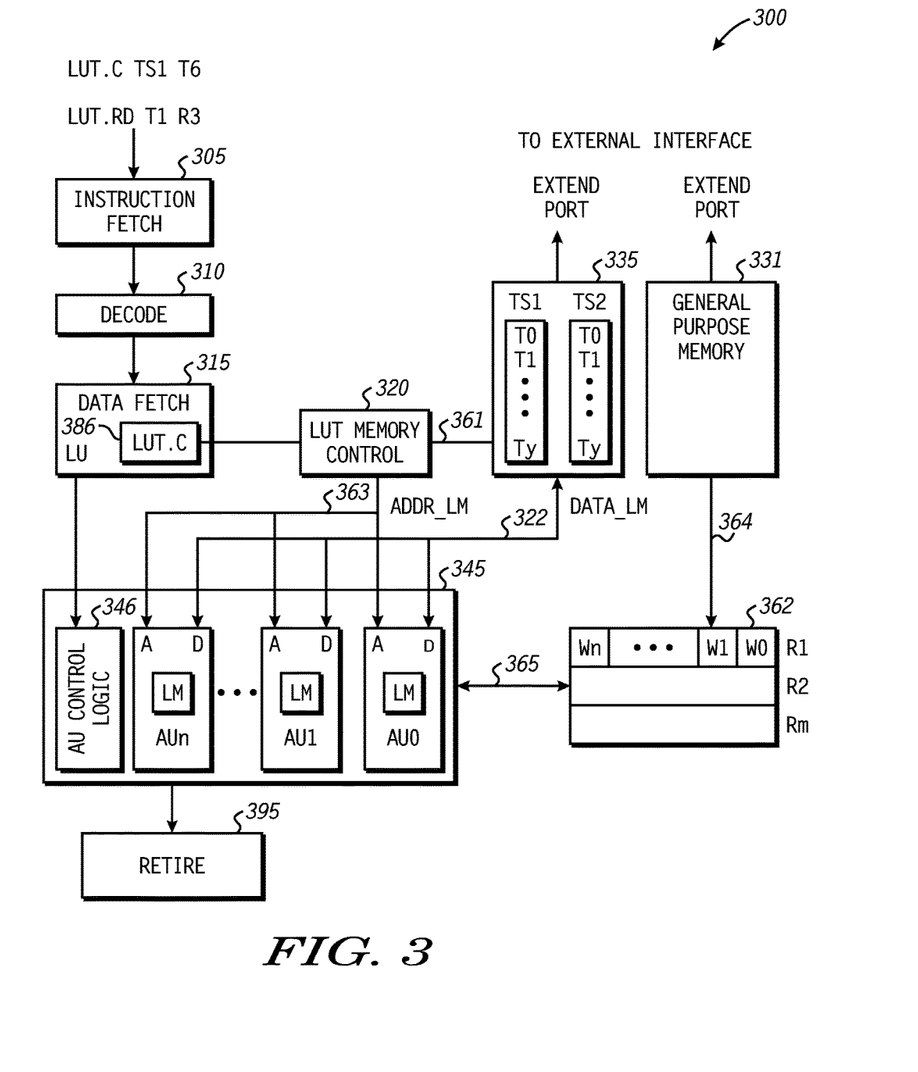
FIG. 3 is a block diagram illustrating a particular embodiment of a single instruction multiple data processor in accordance with a specific embodiment of the present disclosure.

FIG. 3 is a block diagram illustrating a VPU device 300 in greater detail, which can be a particular embodiment of VPU 255 of FIG. 2. VPU 300 illustrates various instruction pipeline stages, a look-up table (LUT) memory control module 320, general purpose memory 331, LUT memory 335, and register file 362.

The various instruction pipeline stages include: instruction fetch stage 305, instruction decode stage 310, data fetch stage 315, AU pipeline 345 and instruction retire stage 395. AU pipeline 345 includes AU control logic 346 and a plurality of AUs (AU0-AUn, where n is an integer). LUT memory 335 stores sets of tables, and is specifically illustrated to store a set of tables labeled TS1 and a set of tables labeled TS2, each of which is further illustrated to have a plurality of tables T0 through Ty, where y is an integer.

The various pipeline stages of VPU 300 represent control logic circuitry of a simplified pipeline architecture. The instruction fetch stage 305 determines the address of memory to be fetched based upon a program counter. While not explicitly shown, the instruction fetch unit 305 can be connected to memory that is local to VPU 300, such as general purpose memory 331, to an instruction cache, or to memory that is external from VPU 300. Fetched instructions are provided to decode stage 310, which decodes the instructions to generate one or more commands (e.g., control signals) that are provided to subsequent pipeline stages.

Commands provided to the data fetch stage 315 by the decode stage 310 can include address information that directly or indirectly identifies the location of operands to be used by a currently executing instruction. For example, the address information can identify a location of general purpose memory or a specific register of a file register. In another example, commands can provide address information that identifies a block memory to be transferred in response to executing the instruction. For example, the data fetch stage 315 can be connected to LUT memory controller circuitry 320 (which can be considered part of the data fetch stage 315), which is configured by the data fetch stage 315 to operate similarly to a direct memory access (DMA) controller. In an embodiment, during execution of a table transfer instruction (e.g., an instruction having the mnemonic "lut.c ts1 t6"), a circuitry portion 386 of the data fetch stage 315 provides commands that configure the LUT memory control 320 to transfer a particular table (e.g., table t6) from one of the available table sets (e.g., ts1) stored at LUT memory 335 to the local memory (LM) of each one of AU0-AUn. Such a table transfer instruction is effectively a block move instruction that results in a particular block of information being copied from one location to a plurality of other locations.

A table transfer instruction may be followed by a table lookup instruction, calling for the looking up of a value in the table. In some embodiments, each LM within the AU is capable of storing up to two tables such that one table can be used for an active vector lookup while the other table (for the next set of lookups) can concurrently be fetched from LUT memory 335. This allows efficient pipelining where an AU is not forced to wait for a table to be fetched to commence a table lookup operation. The AU in steady state is always processing a lookup instruction corresponding to one or the other of the stored tables.

Note that while the table transfer instruction (lut.c) results in data being stored in the local memory of each of AU0-AUn, the table transfer instruction is not a SIMD instruction in that it does not result in any data being processed by the individual AUs (AU0-AUn). For example, in response to an lut.c instruction, the arithmetic AU pipeline control logic 346 does not receive any commands from prior pipeline stages for processing data by the actual arithmetic circuitry of AU0-AUn. However, SIMD commands do result in decoded information being provided to the pipeline logic 346, which in turn provides a common set of commands to each one of AU0-AUn to effectuate a corresponding plurality of vector operations.

The AU pipeline 345 is connected to register file 362 via interconnect 365 to directly access one or more vector registers of register file 362 during execution of a SIMD instruction. For example, commands from decode stage 310 can direct the AU control logic 346 to provide command information to register file 362 to provide the vector stored at one of its registers to AU0-AUn, wherein each one of AU0-AUn receives a corresponding portion of the returned vector.

For example, during execution of a SIMD instruction the AU control logic 346 can provide address information to the register file 362 to receive information from a particular register, which for purposes of discussion is presumed to be register R1. In response, the register file 362 returns the vector stored at register R1 via interconnect 365. Each one of AU0-AUN will receive a data value from a corresponding portion of vector R1. By way of example, information at storage location W0 of R1 is provided to AU0, information at storage location W1 of R1 is provided to AU1, and so on. It will be appreciated, that the bit size of each one of the storage locations W0-Wn will have a common size that is fixed based the architectural definition of the VPU 300.

Each one of AU0-AUn has an address port (A) connected to LUT memory controller 320, and a data port (D) connected to LUT memory 335. In other embodiments, the AUs may be divided into clusters, each cluster containing multiple ports. During a data transfer operation, the LUT Memory controller 320 can provide source addresses to the LUT memory 335 via interconnect 361 and destination addresses to the address port of each of the AUs via interconnect 363. In response, the LUT memory 335 provides the requested source data to data bus 322, which is subsequently stored at a corresponding destination address of each AU's local memory. It will be appreciated that each one of AU0-AUn can be connected to LUT memory controller 320 to receive the same destination addresses.

The general purpose memory 331 can be connected to receive address and control information (not shown) from the data fetch stage 315, as can the register file 362. Based upon an instruction being executed, the data fetch stage 315 can transfer source information from the general purpose memory 331 to the register file 362, or source information from the register file 362 to the general purpose memory 331, via interconnect 364.

In accordance with a particular embodiment, VPU 300 includes table transfer circuitry, which can be represented by block 286 of FIG. 2, that in response to receiving a table transfer instruction results in a specific table of the sets of tables stored at LUT memory 335 being copied to the local memory (LM) of each one of AU0-AUN. As indicated at FIG. 3, a table transfer instruction represented by the mnemonic "lut.c ts1 t6" can be fetched by the instruction fetch stage 305, wherein lut.c is the opcode of the table transfer instruction, ts1 indicates a specific set of tables (e.g., the first set of tables, TS1) from which a table is to be copied, and t6 indicates a particular table (e.g., the sixth table) of the set of tables ts1 that is to be transferred.

By way of example, it is presumed that at the time the lut.c instruction is executed that VPU 300 has a priori knowledge as to the location of the identified table. For example, each set of tables, and each table within the set, can have a fixed size and location that is defined by design, or by register information (not shown). Thus, in response to instruction lut ts1 t6, the decode stage 310 will provide commands to data fetch stage 315 that identify a source address of the table in the LUT memory 335 and a destination address of each AU's local memory. In turn, the data fetch stage 315 will provide commands to LUT memory controller that implement the table transfer from the identified source address of the LUT memory 335 to the LMs of each AU. In an embodiment, the LM of each AU can be accessed by LUT memory controller 320 through a dedicated memory port that allows each one of the AUs to concurrently execute commands under the control of AU control logic 346, including accessing information from the register file 362, while their local memory is being accessed.

Figure 4:
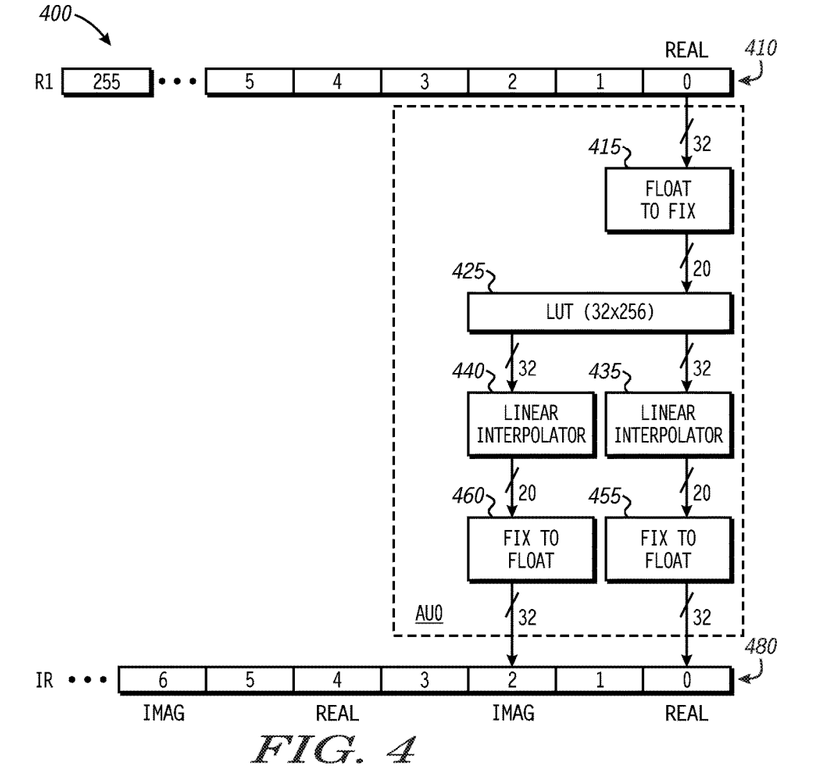
FIG. 4 is a block diagram illustrating the operation of components of an arithmetic unit of a vector processor in performing table lookup and linear interpolation of a complex input value in accordance with a specific embodiment of the present disclosure.

FIG. 4 is a combination block and flow diagram 400 illustrating various logic circuitry, that can be an embodiment of VPU 300, used to execute a table lookup interpolation instruction, such as instruction "lut.rd t1 r1". Specifically illustrated is one of the plurality of AUs (AU0). It will be appreciated that the AUs that are not illustrated are configured and operate in a similar manner as AU0. Block 410 represents register R1, which has been accessed in response to being indicated in the instruction "lut.rd t1 r1". In the illustrated embodiment, the storage location W0 of the vector register R1 (see FIG. 3) includes four segments 0-3, which are referred to herein as segments R1[3:0]. By way of example, each segment of the vector registers is presumed to have a fixed size of 32-bits. Thus, for a VPU having 64 AUs, each vector register will have 256 segments, labeled from 0 to 255.

FIG. 4 is a combination block and flow diagram illustrating various logic circuitry, that can be an embodiment of VPU 300, used to execute a table lookup interpolation instruction, such as instruction "lut.rd t1 r1". Specifically illustrated is one of the plurality of AUs (AU0). It will be appreciated that the AUs that are not illustrated are configured and operate in a similar manner as AU0. Block 410 represents register R1, which has been accessed in response to being indicated in the instruction "lut.rd t1 r1". In the illustrated embodiment, the storage location W0 of the vector register R1 (see FIG. 3) includes four segments 0-3, which are referred to herein as segments R1 [3:0]. By way of example, each segment of the vector registers is presumed to have a fixed size of 32-bits. Thus, for a VPU having 64 AUs, each vector register will have 256 segments, labeled from 0 to 255.

Prior to execution of the table lookup instruction lut.rd t1 r1, lookup information to be used by each one of the AUs is stored at vector register R1, such that the first segment R1[0] stores lookup information that is used by AU0, the fifth segment R1[4] stores lookup information that is to be used by AU1, and so on. The lookup information can include one or more values which can themselves be integer or floating point values. By way of example, the lookup information used by each AU is presumed to be a 32-bit floating point real number.

At block 415, a logic circuitry of AU0 converts the 32-bit floating point number to a 20-bit fixed-point number that is used as a lookup value to LUT 425. For example, the 20-bit fixed-point number can include a lookup value portion and an interpolation value portion, wherein the lookup value is used by circuitry of LUT 425 of AU0 to retrieve one or more table resultant values from its local memory and the interpolation value is used to determine an interpolated resultant based upon the one or more table resultant values. In some embodiments, the lookup value portion may consist of the most significant bits of the number and the interpolation value portion may consist of the least significant bits of the number. In the present example, it is presumed that each lookup value provided to LUT 425 results in two number resultant values being read from the local memory corresponding to real and imaginary parts of the resultant. The real and imaginary component numbers are provided to the linear interpolation circuitry units 435 and 440, respectively.

Interpolation is performed on both the real and imaginary values at blocks 435 and 440, respectively. It will be appreciated that interpolation is the computation of non-given values between given values.

At circuitry blocks 455 and 460 the real and imaginary values obtained by interpolation can be converted from fixed point to floating point values and saved to an internal vector IR represented by block 480, which can in turn be saved at a vector of a register file such as register file 362, or can be fed back as an accumulate input to the AUs. The AUs can perform further processing on this vector, such as perform multiply and accumulate operations based upon the returned 32-bit value.

In other embodiments, the input numbers need not undergo conversion from fixed to floating or vice versa. The lookup tables can, for example, accept floating point input. In many embodiments, table lookup commands can involve real-valued functions. In such cases, the lookup of a single real number input will produce a single real number output. In some embodiments, the table t1 and the vector register can be identified in alternate manners, rather than being provided as parameters of an instruction. An identification of a lookup table or a vector register may be prefetched to specific internal locations, or be indicated by setting register bits, etc.

Figure 5:
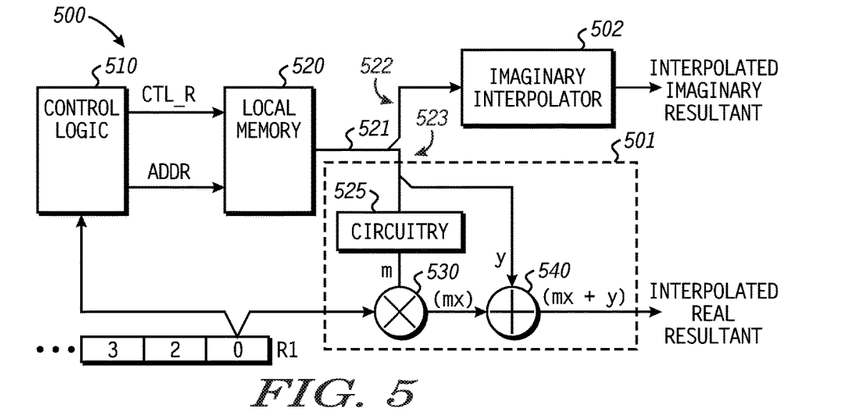
FIG. 5 is a block diagram illustrating a particular implementation of logic implementing a table lookup interpolation instruction.

FIG. 5 is a block diagram 500 illustrating a particular embodiment of components of an AU that can be used to perform a table lookup and linear interpolation based upon an input value. Control logic 510 represents circuitry of a specific AU that receives commands from one or more of the decode stage 310 and the AU control logic 346 (not shown) in response to table lookup and interpolation instructions being executed. In response to receiving commands to implement the table lookup interpolation command, the control logic 510 accesses the lookup value stored at the relevant portion (e.g., segment S0) of an identified vector register (e.g., R1). In the embodiment of FIG. 5, a most-significant-bit portion (e.g., bits (31:24)) of segment R1 [0] stores the lookup information used to access a table local memory. Based upon the lookup value, control logic 510 provides an address (ADDR) and control signals (CTL_R) to the local memory 520 to access two numbers that are provided to interconnect 521. The two numbers can be provided concurrently at two different ports or in series at a single port. Interpolation is performed upon these two numbers, the reference number 523 corresponding to the real components, and the reference number 522 corresponding to the imaginary components. The real components 523 are provided to a block 501 to determine an interpolated real resultant of the final complex resultant. For example, a slope can be determined at circuitry 525 based on the real components. Thus, given two resultant values $v_0$ and $v_1$, found by looking up $x_0$ and $x_1$ in a lookup table, then the slope m may be calculated as $$m=(v_1-v_0)/(x_1-x_0).\qquad\text{Equation 1}$$

Given a fixed distance d between lookup values, the above equation may be simplified to $$m=(v_1-v_0)/d.\qquad\text{Equation 2}$$

This calculated slope (m) is provided to a multiplier 530, which multiplies the calculated slope by a portion of the information stored at segment R1[0]. The result of this calculation is added to a y-intercept value (Y-INT), which may also be calculated from a portion of the information stored at segment R1 [0]. Therefore, the output from the adder 540 is the interpolated result of the real portion of the complex number. This result can be further manipulated or stored in a register of the AU for further processing.

Similarly, the imaginary components 522 of the accessed complex numbers are provided to an imaginary interpolator 502 to determine an interpolated imaginary component of the final resultant. The imaginary interpolator performs a similar calculator to the real interpolator. The interpolators may operate independently. In some embodiments, a single interpolator may perform both interpolator operations, one after the other.

Figure 6:
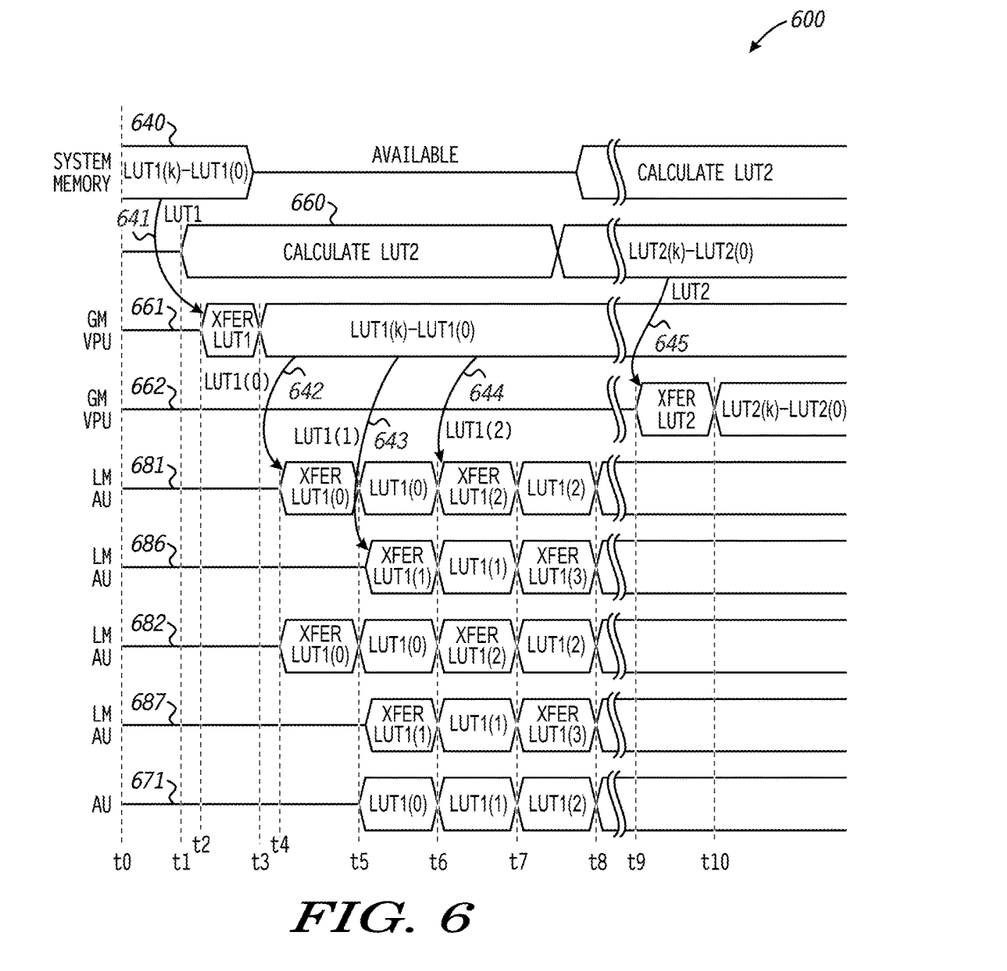
FIG. 6 is a timing diagram illustrating various stages of operation of the system of FIG. 1 in accordance with a specific embodiment.

FIG. 6 is a graph 600 illustrating the creation and movement of lookup tables using a VPU that supports the lut.c and lut.rd instructions in accordance with a particular application, presumed to be the digital front end (DFE) of FIG. 2 that implements digital pre-distortion. The horizontal axis of the graph 600 represents time, and the vertical axis represents various involved portions of the communication system of FIG. 2: the DFE, a system memory, for example, a memory external to VPU 255 such as memory 235, the VPU, and the AUs. Waveforms 640 and 641 represent activity at different storage locations of the system memory where sets of lookup tables (e.g., LUT1 and LUT2) are stored. Waveforms 661 and 662 represent activity at different storage locations of the global memory of a VPU. Waveforms 681 and 686 represent activity at different storage locations of the local memory of one of the AUs (AU0) of the VPU. Waveforms 682 and 687 represent activity at different locations of the local memory of another one of the AUs (AU1) of the VPU. Waveform 671 indicates the information being used by the AUs to calculate a result at a given time.

At time T0, a first set of lookup Tables (LUT1) having individual lookup tables LUT1(0)-LUT1(k) has already been calculated by lookup table generator logic, such as by the processor 225, and is stored at the system memory as represented by waveform 640. At time T1, the lookup table generator begins generating a next set of lookup tables (LUT2) that are being stored at a different location of the system memory than LUT1 as indicated by waveform 660.

At time T2, a transfer of LUT1 from system memory to the global memory of the VPU begins as indicated by arrow 641. This transfer completes at time T3, see waveform 661, at which time LUT1 is completely transferred and system memory storing LUT1 is available to store other information.

At time T4, the transfer of one of the LUT1 lookup tables (LUT1(0)) to each one of the AUs of the VPU begins as indicated by arrow 642. (AU0 and AU1 are specifically illustrated.) At time T5, the transfer of LUT1(0) to each AU's local memory is complete, and the AUs can implement a desired arithmetic operation by accessing the lookup table from its local memory, as indicated by waveform 671. Beginning at time T6, the next lookup table (LUT1(1)) to be used to implement the arithmetic operation is loaded into a different location of each AU's local memory as indicated by arrow 643. This transfer can be concurrent with the AU's use of the previously transferred table, LUT1(0). This transfer, and use, of individual lookup tables continues until each lookup table of LUT1 (LUT1(k)-LUT1(0)) have been transferred and accessed by a particular arithmetic operation. In FIG. 6, the transferring of LUT1(2) to the AUs is also illustrated at time T7 as indicated by arrow 644.

In parallel to the AU's generation of pre-distorted communication signals, the lookup table generator of processor 225 can continue to generate a next lookup table (LUT2) until completed between T7 and T8. LUT2 can then be transferred to a different location of the global memory of the VPU for subsequent use. The transfer is indicated by arrow 645. It begins at time T9 and completes at time T10. In this manner, the set of tables used to implement a particular application, such as digital pre-distortion can be updated simultaneously, as needed.

Figure 7:
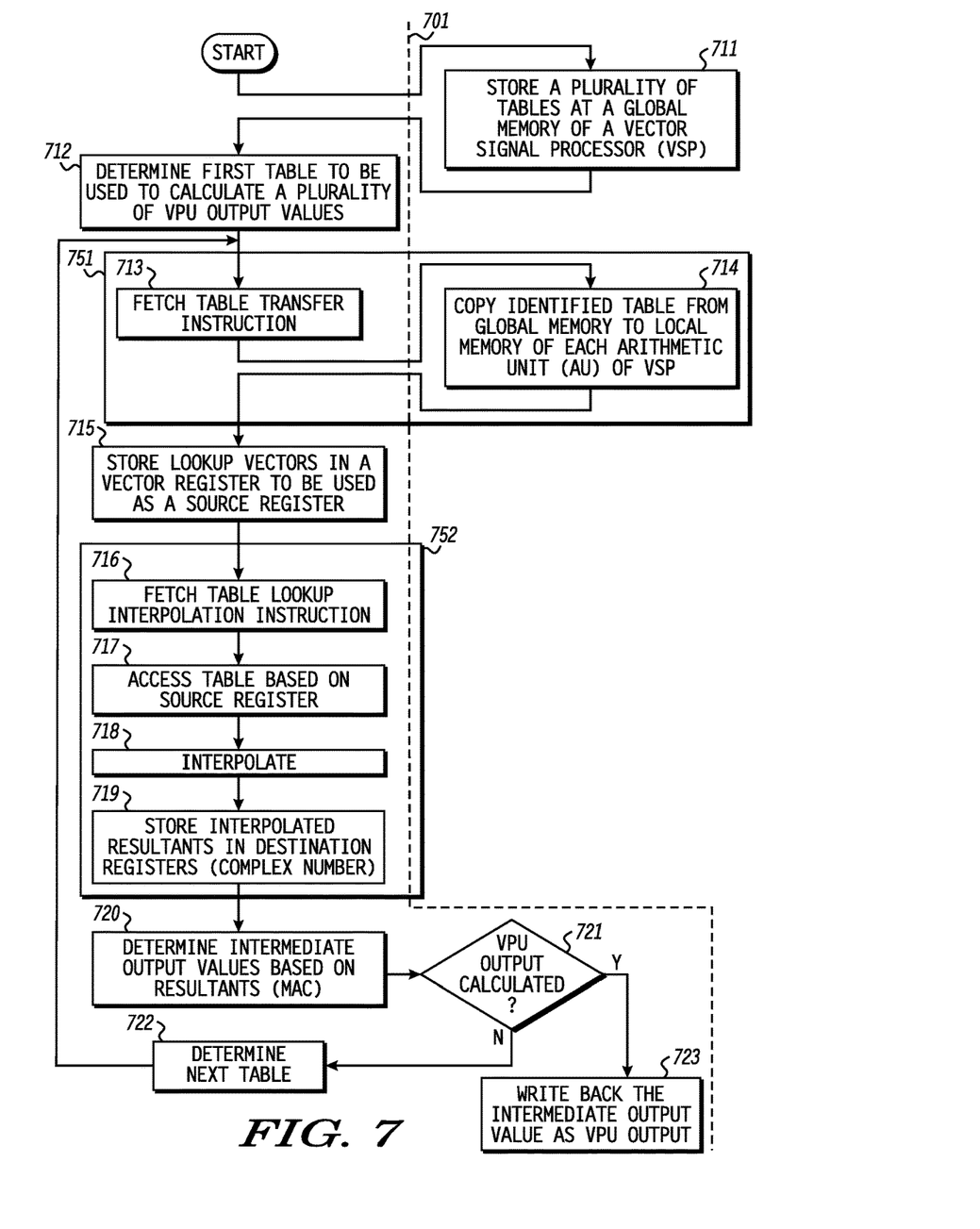
FIG. 7 is a flow diagram illustrating a method in accordance with a specific embodiment of the present disclosure.

FIG. 7 illustrates a flow diagram of a particular application that takes advantage of a SIMD table copy instruction and a SIMD table lookup interpolation instruction. Flow begins at block 711 where a plurality of tables is stored at global memory of a vector signal processor (VPU). Block 711 is illustrated at the right side of a vertical line 701 to indicate that the operation of storing tables can occur concurrently with the execution of instructions at a VPU. For example, the global memory of the VPU can have dedicated memory port.

At block 712, the application being executed determines a first table of a plurality of tables that is to be used to calculate a plurality of arithmetic unit (AU) output values, wherein each AU of the VPU will calculate one AU value of the plurality of AU output values. Thus, for example, a plurality of elements, Y(t0)-Y(t31), corresponding to a digital communication signal at different times, can be simultaneously generated, one by each AU.

At block 713 a table transfer instruction is fetched by the VPU. Operations performed as a result of the table transfer instruction being fetched and executed are identified by box 751. At block 714, the table identified by execution of the table transfer instruction is copied from the global memory of the VPU to the local memory of each AU of the VPU. Block 714 is illustrated on the right side of vertical line 701 to indicate that the operation of copying information from the global memory of the VPU to each AU's local memory can occur in parallel with the execution of other AU and VPU operations.

At block 715, the application code stores lookup values in a vector register that is to be used subsequently used as a source register. For example, a plurality of lookup values, one for each AU, can be stored at the vector register.

At block 716, the table lookup interpolation instruction is fetched. Operations performed as a result of the table lookup interpolation instruction are identified by the dashed box 752. At block 717, each AU accesses the table stored in its respective local memory based upon the lookup value stored at a corresponding portion of an indicated source register. The lookup value and lookup resultant are used to interpolate a final resultant at block 718.

At block 719, the interpolated resultant is stored in the destination register for further use. According to an embodiment, each table lookup can result in two values being fetched that represent the real and imaginary components of a complex number.

At block 720, the application uses the interpolated results in order to calculate an intermediate output value. For example, each AU can use its interpolated resultant in a multiply and accumulate operation wherein the accumulated result is stored at a destination register until all multiply accumulate operations are completed for a given set of output values.

At block 721, a determination is made as to whether or not calculation of the AU output values has been completed. If not, flow proceeds to block 722 where the next lookup table to be used to calculate the plurality of the AU outputs is determined. From block 722, flow proceeds to block 713, where the newly determined lookup table is transferred to the local memory of the AUs. It will be appreciated, that the application may determine and transfer the next lookup table while still using the current lookup table, so that the next lookup table can be transferred to local memory in parallel with use of the previous lookup table.

If at block 721 it is determined that the plurality of AU outputs have been calculated, at block 723 the plurality of output values are written back from the plurality of AUs to the global memory, or other storage information.

Figure 8:
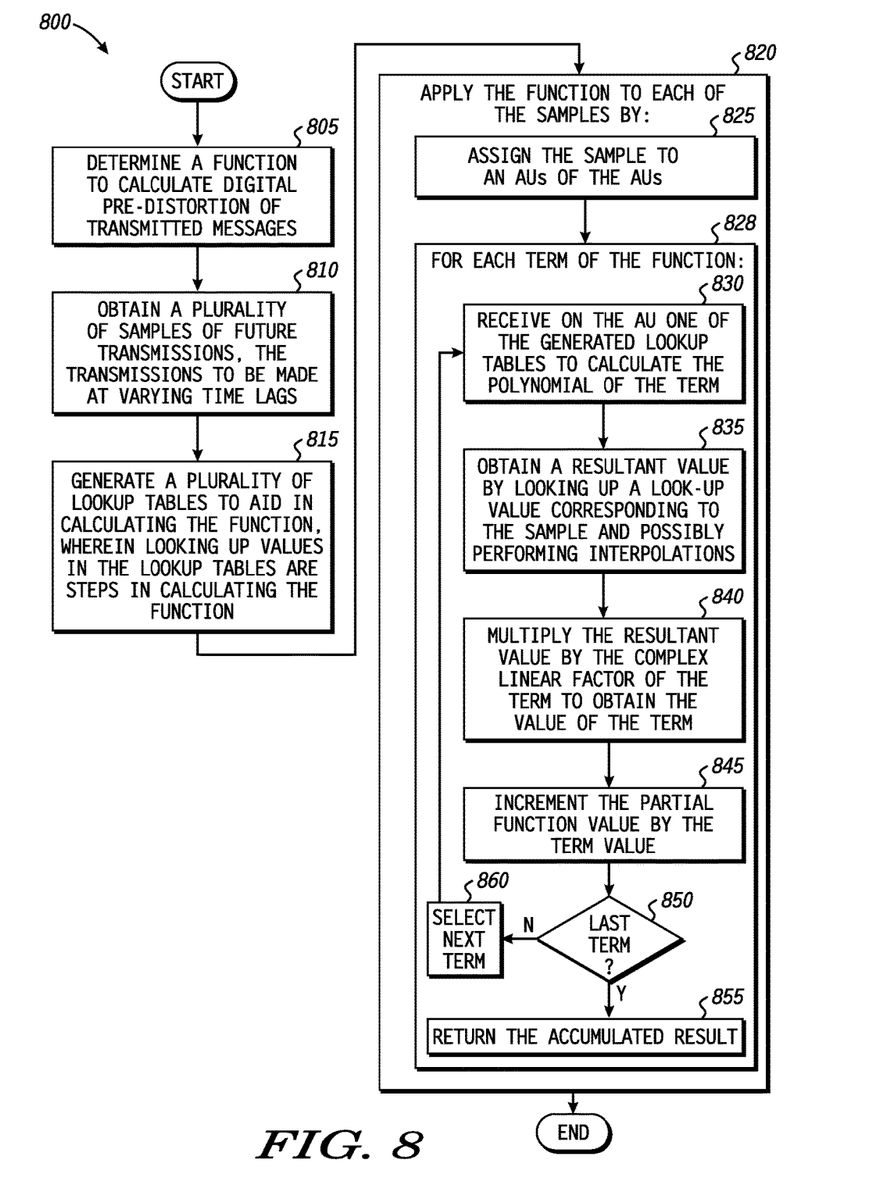
FIG. 8 is a flow diagram illustrating a method of compensating for power amplifier distortion in a wireless device with a vector processor architecture in accordance with a specific embodiment of the present disclosure.

FIG. 8 is a flow diagram illustrating a method 800 for compensating for power amplifier distortion in a wireless device with a vector processor architecture in accordance with a specific embodiment of the present disclosure. Method 800 begins with determining a function y to calculate digital pre-distortion of transmitted messages, at step 805. The function y may be a polynomial. In some embodiments, the function y may be a sum of terms, where each term is the product of a complex value and a polynomial with a real input. In further embodiments, each polynomial may be a 9-degree or smaller polynomial whose argument is a real number. In these embodiments, the number of terms of the polynomial may generally be no greater than 15.

The function y may, for example, assume the form $$y(t) = \sum_{\{r,q\} \in S} x(t-r) P_{r,q}(|x(t-q)|) \quad \text{Equation 4}$$

In Equation 4, the input x is a complex variable representing the real and imaginary part of the incoming signal, S is an arbitrary index set of time lags, r and q are elements of the set S, and $P_{r,q}$ is a polynomial with coefficients dependent on r and q. In some embodiments, the coefficients may be complex. The symbol |z| denotes the absolute value of the complex number z. If z=a+bi, then $|z|=(a^2+b^2)^{1/2}$. The symbol Σ indicates summation. As an example, where r=0 (indicating a zero time lag) and q=3, a corresponding term of the summation is x(t–0) $P_{0,3}$(|x(t–3)|). Thus, each polynomial P is a polynomial of a real variable. However, the polynomial output can be complex due to the polynomial coefficients being complex. The function y is a sum of terms. Each term is a product of a complex number x(t–r) and the value of a polynomial P on the real variable |x(t–q)|. In other embodiments, $P_{r,q}$ may be a general function dependent on the parameters r and q, rather than limited to a polynomial function.

Method 800 includes obtaining a plurality of samples of future transmissions, the transmissions to be made at varying time lags, at step 810. At step 815, a plurality of lookup tables to aid in calculating the function is generated. Looking up values in the lookup tables may constitute steps in calculating the function. In the above example, for instance, a lookup table may be generated for each polynomial $P_{r,q}$ contained in the summation. The lookup table for the polynomial may be used to calculate the values of the polynomial on its argument. The use of the lookup tables may facilitate real time calculation of y(t). Each lookup table may indicate, for each of a range of possible look-up values representing sample values, a resultant value.

At step 820, the function y is applied to each of the samples. This application includes assigning an AU to each sample to calculate the value of the function for the sample, at step 825. In step 828, the terms of the function, such as the terms of the function of Equation 1, are calculated and summed. For each term, at step 830, the AU receives a generated lookup table to calculate the polynomial of the term. At step 835, the AU obtains a resultant value by looking up a look-up value corresponding to the sample on the lookup table. In some cases, interpolation may be used to obtain a resultant value. In performing these calculations, multiple AUs may perform table lookups of values based upon a single SIMD table lookup command.

At step 840, the AU multiples the resultant value by the complex linear factor of the term to obtain the value of the term. At step 845, the partial function value is incremented by the term value. If the term is the last term, at step 850, the accumulated result is returned as the value of the function at step 855. Otherwise, the next term is selected at step 860 and the process of calculating the value of the term and accumulating the result is continued at step 830.

The calculation described in step 820 of compensating for predistortion of an audio sample may be summarized as follows:

a. Initialize the partial sum=0
b. Determine the value of the polynomial P of the current term, by looking up the value of its argument in a lookup table for P. Distinct polynomials may use distinct lookup tables.
c. Multiply the value of P by the complex factor x to obtain the value of the term.
d. Increment the partial sum by the value of the term.
e. If all terms have been calculated, return the partial sum, which is now the value of the function y. Otherwise, return to step ii. to calculate the next term.

In accordance with at least one embodiment, a data processor includes a vector processor unit (VPU), which includes a lookup table memory to store a set of tables, a plurality of arithmetic units (AUs), each AU including local memory, and instruction execution circuitry. In response to receiving a table transfer instruction, the instruction execution circuitry executes the table transfer instruction that implements a transfer of a block of data, identified by the instruction, from the lookup table memory to the local memory of each AU. In addition, the execution results in each AU accessing information stored at its corresponding local memory upon which a resultant value is based.

In accordance with at least one embodiment, the local memory within each AU is configured to receive the block of data concurrently with the AU executing another instruction. In accordance with at least one embodiment, the lookup table stored in each local resource is to include an additional row that stores information that is duplicative of information stored at a last row of the lookup table transferred from the lookup table memory. In accordance with at least one embodiment, the data processor is configured to pre-distort a digital representation of an analog signal based upon execution of the table transfer instruction and the table lookup instruction at the VPU. In accordance with at least one embodiment, the resultant value of the table lookup instruction is an interpolated value based upon the accessed information. In accordance with at least one embodiment, the VPU is to store a plurality of lookup values, corresponding to the plurality of AUs in a vector of a vector register. Further, the instruction circuitry includes each AU accessing its information based on a lookup value obtained from its corresponding portion of the vector.

In accordance with at least one embodiment, the local memory of each AU has capacity to store at least two lookup tables. Further, the local memory of each AU comprises a dedicated port that receives transferred blocks of data from the lookup table memory of the VPU.

In accordance with at least one embodiment, a system includes a lookup table generation module configured to generate a plurality of lookup tables of digital pre-distortion information, first memory configured to store the plurality of lookup tables, direct memory access circuitry configured to transfer the lookup tables from the first memory to a second memory that is a local memory of a vector processor (VPU); and the VPU. The VPU includes the second memory, a plurality of arithmetic units (AUs), each AU including a third memory that is local memory of its corresponding AU, and instruction execution circuitry. The instruction execution circuitry is configured to distort a digital representation of an analog signal based upon the digital pre-distortion information to generate a digital representation of a distorted analog signal based upon execution of a memory block transfer instruction. The memory block transfer instruction implements a transfer of a lookup table of the plurality of lookup tables, identified by the instruction, from the second memory to the third memory of each AU. Execution of the table lookup instruction implements a table lookup at each AU to access information upon which a resultant value is based, the information accessed from each AU's corresponding third memory in response to receiving the table lookup instruction.

In accordance with at least one embodiment, the system further includes a digital-to-analog converter configured to provide a distorted analog signal based upon the digital representation of the distorted analog signal. It also further includes a power amplifier to provide an amplified analog signal to an output based upon the distorted analog signal. The output is coupled to the lookup table generation module. The lookup table generation module is configured to base the plurality of lookup tables on feedback information from the amplified analog signal. In accordance with at least one embodiment, the system further includes an analog-to-digital converter to provide the feedback information based upon the amplified analog signal at the output.

In accordance with at least one embodiment, the VPU further includes a vector register configured to store a plurality of lookup values corresponding to the plurality of AUs in a vector of the vector register. Each AU is to effectuate its table lookup based on its corresponding lookup value obtained from the vector. In accordance with at least one embodiment, the system further includes an antenna coupled to the output.

In accordance with at least one embodiment, a method includes executing a lookup table transfer instruction on a vector processor (VPU). The VPU includes a plurality of arithmetic units (AUs). The method further includes transferring a block of data containing a lookup table from a lookup table memory of the VPU to a local memory of each of the AUs as a result of executing the lookup table transfer instruction. The lookup table memory of the VPU contains a plurality of lookup tables. The method further includes executing a table lookup instruction on the VPU. The method further includes effectuating a table lookup, at each AU, from the lookup table stored at each AU's corresponding local memory as a result of executing the table lookup instruction. The method further includes obtaining a resultant value based upon the table lookup.

In accordance with at least one embodiment, the method further includes obtaining the resultant value by use of interpolation. In accordance with at least one embodiment, the use of interpolation includes receiving a value, setting a lookup value to a most significant m bits of the value, obtaining two resultant values from the lookup table based upon the lookup value, multiplying a difference of the two resultant values by a least significant n bits of the value, thereby obtaining a product, and adding the product to a y-intercept value. The value comprises m+n bits or fewer.

In accordance with at least one embodiment, executing the lookup table transfer instruction further includes the VPU selecting the lookup table from the plurality of lookup tables stored in the lookup table memory, and transferring the block of data includes concurrently providing the block of data to each AU.

In accordance with at least one embodiment, the method further includes performing a calculation in stages. Each stage includes executing at the VPU a lookup table transfer instruction for the stage. The execution includes selecting a lookup table for the stage from the plurality of lookup tables stored in the global table memory of the VPU, and concurrently providing the lookup table to each AU for storage in the local memory of the AU. The method further includes selecting at the VPU a lookup value for each AU. The method further includes executing at the VPU a table lookup instruction for the stage comprising each AU. This execution includes looking up the lookup value for the AU in the lookup table stored in the local memory of the AU, thereby obtaining a resultant value for the stage, and storing at the AU an intermediate result of the stage. Except for a first stage of the calculation, the AU bases the intermediate result upon an immediately previous intermediate result of the AU and upon the resultant value. The method further includes each AU transmitting to the VPU a final value obtained as a result of performing the stages of the calculation.

In accordance with at least one embodiment, at each stage the calculation comprises a calculation of a real and a complex portion of a complex number. In accordance with at least one embodiment, the calculation is of digital pre-distortion. A function to calculate digital pre-distortion is of a form:

$$y(t) = \sum_{[r,q] \in S} x(t-r) P_{r,q}(|x(t-q)|)$$

where x is a complex variable representing real and imaginary components of an incoming signal, S is an arbitrary index set of time lags, r and q are elements of the set S, and $P_{r,q}$ is a function dependent on the parameters r and q. At each stage of the calculation, one term of the function y(t) is calculated. The calculation uses a stage resultant value from a table lookup of a stage lookup value representing x(t−q) to obtain a value of $P_{r,q}(|x(t-q)|)$. The calculation multiplies the stage resultant value by x(t−r) to obtain a stage product, and adds the stage product to a partial sum of results of previous stages to obtain an updated partial sum for the stage.

What is claimed is:

1. A vector processor unit (VPU), the VPU comprising:
   a lookup table memory to store a set of lookup tables;
   a plurality of arithmetic units (AUs), each AU comprising local memory; and
   instruction execution circuitry configured to, in response to receiving a table transfer instruction, execute the table transfer instruction, wherein the table transfer instruction identifies a block of data containing a first lookup table and wherein execution of the table transfer instruction results in a transfer of the block of data from the lookup table memory to the local memory of each AU, and the instruction execution circuitry further configured to, in response to receiving a table lookup instruction, execute the table lookup instruction which results in each AU accessing information stored at its corresponding local memory to obtain a resultant value.

2. The VPU of claim 1, wherein the local memory of each AU is configured to receive the block of data concurrently with the each AU executing another instruction.

3. The VPU of claim 1, wherein the local memory of each AU stores a second lookup table which includes an additional row that stores information that is duplicative of information stored at a last row of the first lookup table contained in the block of data transferred from the lookup table memory.

4. The VPU of claim 1, wherein the VPU is configured to pre-distort a digital representation of an analog signal based upon execution of the table transfer instruction and the table lookup instruction at the VPU.

5. The VPU of claim 1, wherein the resultant value is an interpolated value based upon the accessed information.

6. The VPU of claim 1, wherein:
the VPU is configured to store a plurality of lookup values, corresponding to the plurality of AUs, in a vector of a vector register; and
execution by the instruction execution circuitry of the table lookup instruction includes each AU accessing the information stored at its corresponding local memory based on a lookup value obtained from its corresponding portion of the vector.

7. The VPU of claim 1, wherein the block of data is one of the set of lookup tables, and the local memory of each AU has capacity to store at least two lookup tables of the set of lookup tables.

8. The VPU of claim 7, wherein the local memory of each AU comprises a dedicated port that receives transferred blocks of data from the lookup table memory of the VPU.

9. A system comprising:
a lookup table generator configured to generate a plurality of lookup tables of digital pre-distortion information;
first memory configured to store the plurality of lookup tables;
direct memory access circuitry configured to transfer the lookup tables from the first memory to a second memory that is a local memory of a vector processor (VPU); and
the VPU, wherein the VPU comprises:
the second memory;
a plurality of arithmetic units (AUs), each AU comprising a third memory that is local memory of its corresponding AU; and
instruction execution circuitry configured to distort a digital representation of an analog signal based upon execution of a block transfer instruction and a table lookup instruction, the execution of the block transfer instruction to identify a first lookup table of the plurality of lookup tables and to effectuate a transfer of the first lookup table from the second memory to the third memory of each AU, and the execution of the table lookup instruction to effectuate a table lookup by each AU to access information from each AU's corresponding third memory for calculation of the distorted digital representation of the analog signal.

10. The system of claim 9 further comprising:
a digital-to-analog converter configured to provide a distorted analog signal based upon the distorted digital representation; and
a power amplifier configured to provide an amplified analog signal to an output of the power amplifier based upon the distorted analog signal at an input of the power amplifier, the output coupled to the lookup table generation module, wherein the lookup table generation module is configured to base the plurality of lookup tables on feedback information from the amplified analog signal.

11. The system of claim 10, further comprising an analog-to-digital converter configured to provide the feedback information based upon the amplified analog signal at the output.

12. The system of claim 10, wherein the VPU further comprises a vector register configured to store a plurality of lookup values corresponding to the plurality of AUs in a vector of the vector register, wherein each AU is configured to effectuate its table lookup based on its corresponding lookup value obtained from the vector.

13. The system of claim 10, further comprising:
an antenna coupled to the output.

14. A method comprising:
executing a lookup table transfer instruction on a vector processor (VPU) comprising a plurality of arithmetic units (AUs), wherein the lookup table transfer instruction identifies a block of data containing a first lookup table;
as a result of executing the lookup table transfer instruction, transferring the block of data from a lookup table memory of the VPU to a local memory of each of the AUs, wherein the lookup table memory of the VPU contains a plurality of lookup tables including the first lookup table;
executing on the VPU a table lookup instruction, the execution of the table lookup instruction comprising:
providing control signals to the AUs; and
in response to the control signals, at each AU:
effectuating a table lookup from the first lookup table stored at each AU's corresponding local memory; and
obtaining a resultant value based upon the table lookup.

15. The method of claim 14, wherein the resultant value is obtained by use of interpolation.

16. The method of claim 15 wherein the use of interpolation comprises:
receiving a value;
setting a lookup value to a most significant m bits of the value;
obtaining two resultant values from the first lookup table based upon the lookup value;
multiplying a difference of the two resultant values by a least significant n bits of the value, wherein the value comprises m+n bits or fewer, thereby obtaining a product; and
adding the product to a value.

17. The method of claim 14, wherein:
executing the lookup table transfer instruction further comprises the VPU selecting the first lookup table from the plurality of lookup tables stored in the lookup table memory; and
transferring the block of data comprises concurrently providing the block of data to each AU.

18. The method of claim 14, further comprising:
performing a calculation in stages, each stage comprising:
executing at the VPU a lookup table transfer instruction for the stage, comprising:
selecting a lookup table for the stage from the plurality of lookup tables stored in the lookup table memory of the VPU; and
concurrently providing the lookup table to each AU for storage in the local memory of the AU;
selecting at the VPU a plurality of lookup values for the stage comprising a lookup value for each AU; and
executing at the VPU a table lookup instruction for the stage comprising each AU:
looking up the lookup value for the AU in the lookup table stored in the local memory of the AU, thereby obtaining a resultant value for the stage; and
storing at the AU an intermediate result of the stage, wherein, except for a first stage of the calculation, the AU bases the intermediate result upon an immediately previous intermediate result of the AU and upon the resultant value for the stage; and
each AU transmitting to the VPU a final value obtained as a result of performing the stages of the calculation.

19. The method of claim 18, wherein at each stage the calculation comprises a calculation of a real and a complex portion of a complex number.

20. The method of claim 19, wherein:
the calculation is of digital pre-distortion;
a function to calculate digital pre-distortion is of a form:

$$y(t) = \sum_{\{r,q\} \in S} x(t-r) P_{r,q}(|x(t-q)|),$$

wherein:
x is a complex variable representing real and imaginary components of an incoming signal;
t is a variable representing time;
S is an arbitrary index set of time lags;
r and q are elements of the set S; and
$P_{r,q}$ is a function dependent on parameters r and q; and
at each stage of the calculation, one term of the function y(t) is calculated, the calculation comprising:
using a stage resultant value from a table lookup of a stage lookup value representing x(t−q) to obtain a value of $P_{r,q}$ (|x(t−q)|),
multiplying the stage resultant value by x (t−r) to obtain a stage product; and
adding the stage product to a partial sum of results of previous stages to obtain an updated partial sum for the stage.

* * * * *